US012787389B2

(12) United States Patent
Chang et al.

(10) Patent No.: US 12,787,389 B2
(45) Date of Patent: Nov. 3, 2026

(54) SEMICONDUCTOR DEVICES HAVING COUNTER-DOPED STRUCTURES

(71) Applicant: Taiwan Semiconductor Manufacturing Company, Ltd., Hsinchu (TW)

(72) Inventors: Hsiao-Chun Chang, Hsinchu County (TW); Guan-Jie Shen, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 796 days.

(21) Appl. No.: 17/646,620

(22) Filed: Dec. 30, 2021

(65) Prior Publication Data

US 2022/0336587 A1 Oct. 20, 2022

Related U.S. Application Data

(60) Provisional application No. 63/175,856, filed on Apr. 16, 2021.

(51) Int. Cl.

| | |
|---|---|
| ***H10D 62/17*** | (2025.01) |
| ***H10D 30/01*** | (2025.01) |
| ***H10D 30/67*** | (2025.01) |
| ***H10D 62/10*** | (2025.01) |
| ***H10D 64/01*** | (2025.01) |
| ***H10P 14/20*** | (2026.01) |
| ***H10P 30/20*** | (2026.01) |
| ***H10W 15/00*** | (2026.01) |

(52) U.S. Cl.

CPC ......... *H10D 62/371* (2025.01); *H10D 30/031* (2025.01); *H10D 30/6713* (2025.01); *H10D 30/6735* (2025.01); *H10D 30/6757* (2025.01); *H10D 62/118* (2025.01); *H10D 64/017* (2025.01); *H10D 64/018* (2025.01); *H10P 14/3452* (2026.01); *H10P 30/204* (2026.01); *H10P 30/21* (2026.01); *H10W 15/00* (2026.01); *H10W 15/01* (2026.01)

(58) Field of Classification Search

CPC .................................................. H01L 21/0259

See application file for complete search history.

(56) References Cited

U.S. PATENT DOCUMENTS

2020/0220018 A1 * 7/2020 Jang .................... H01L 29/0847

* cited by examiner

*Primary Examiner* — Leonard Chang
*Assistant Examiner* — Hajar Kolahdouzan
(74) *Attorney, Agent, or Firm* — Sterne, Kessler, Goldstein & Fox P.L.L.C.

(57) ABSTRACT

The present disclosure describes semiconductor devices and methods for forming the same. A semiconductor device includes nanostructures over a substrate and a source/drain region in contact with the nanostructures. The source/drain region is doped with a first-type dopant. The semiconductor device also includes a counter-doped structure in contact with the substrate and the source/drain region. The counter-doped structure is doped with a second-type dopant opposite to the first-type dopant.

20 Claims, 13 Drawing Sheets

SEMICONDUCTOR DEVICES HAVING COUNTER-DOPED STRUCTURES

CROSS-REFERENCE TO RELATED APPLICATIONS

The present application claims the benefit of U.S. Provisional Patent Appl. No. 63/175,856, titled "Semiconductor Devices Having Counter-doped Wells" and filed on Apr. 16, 2021, which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices and three-dimensional transistors, such as gate-all-around field effect transistors (GAAFETs) and fin field effect transistors (finFETs), are introduced.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
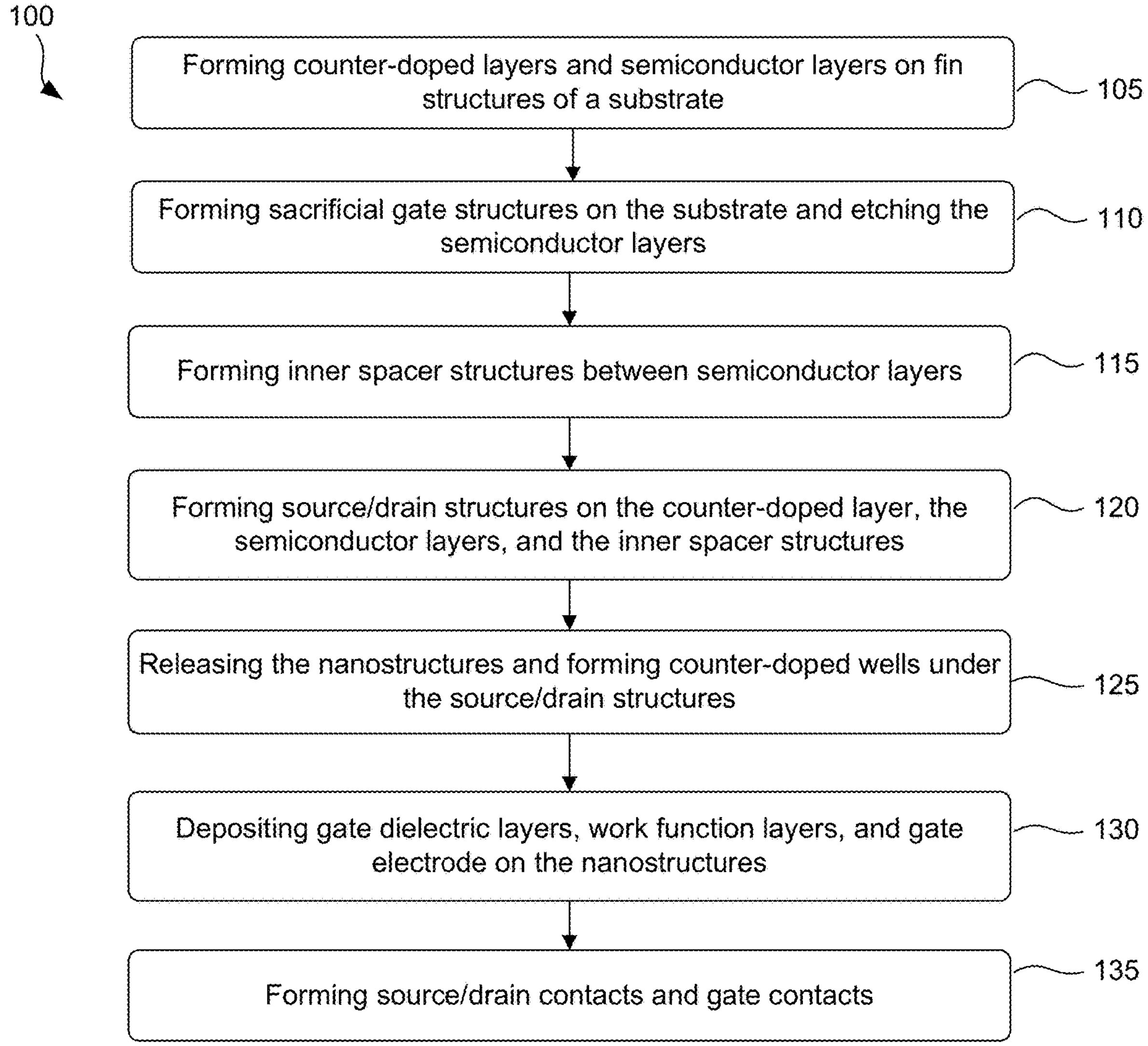
FIG. 1 is a flow diagram of a method for fabricating counter-doped structures in semiconductor devices, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate, such as a semiconductor wafer, or (ii) built with vertical structures.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, ±5% of the value), 10% of the value, 20% of the value, etc.

The present disclosure provides example field effective transistor (FET) devices (e.g., gate-all-around (GAA) FETs, fin-type FET (finFETs), horizontal or vertical GAA finFETs, or planar FETs) in a semiconductor device and/or in an integrated circuit (IC) and example methods for fabricating the same.

GAAFETs and finFETs increase device density and improve device performance. GAAFETs and finFETs include a pair of source/drain regions formed on opposite sides of a channel region. As the semiconductor industry continues to scale down the dimensions of semiconductor devices, circuit complexity has increased at all device levels. For example, beyond the 5 nm technology node or the 3 nm technology node, increased source/drain tunneling can increase leakage current and cause device failure. Short channel effects can also be one of the reasons for device failure. Semiconductor devices implementing nanostructures, such as nanowires and nanosheets, are potential candidates to overcome the short channel effects. Among them, GAAFETs can reduce short channel effects and enhance carrier mobility, which in turn improve device performance. It has become increasingly challenging to further reduce leakage paths formed under a gate stack and between the pair of source/drain regions. For example, during formation of gate stacks, a gate dielectric material and a gate electrode are also formed on top surfaces of the substrate or fin, resulting in a parasitic channel that can act as a leakage path connecting the pair of source/drain structures. Leak current flowing through the parasitic channel can impact off current and reduce device performance.

Various embodiments in the present disclosure describe methods for forming counter-doped structures between source/drain structures and the underlying substrate. Specifically, each counter-doped structure can be formed in contact with both a bottom surface of a source/drain structure and a top surface of the substrate. The counter-doped structures can be doped with dopants that are opposite in conductivity type to the dopants implanted in the source/drain structures. For example, a counter-doped structure doped with n-type dopants can be formed under a source/drain structure doped with p-type dopants, or vice versa. Gate structures can be formed between a pair of source/drain structures as structure as between a pair of counter-doped structures. Counter-doped structures described herein can also be referred to as counter-doped wells, counter-doped regions, counter-doped areas, or the like. The counter-doped structures described in the present application provide various benefits, such as improved device performance and reliability. Benefits can also include, but are not limited to, reduced short channel effects, reduced subthreshold leakage, and improved device on/off current characteristics. The embodiments described herein use GAAFETs as examples and can be applied to other semiconductor structures, such as finFETs and planar FETs. In addition, the embodiments described herein can be used in various technology nodes, such as 14 nm, 7 nm, 5 nm, 3 nm, 2 nm, and lower technology nodes.

FIG. 1 is a flow diagram of a method 100 for fabricating a semiconductor device incorporating counter-doped structures, according to some embodiments. For illustrative purposes, the operations illustrated in FIG. 1 will be described with reference to the example fabrication process of fabricating a semiconductor device 200 as illustrated in FIGS. 2A-2D, 3A, 3B, and 4-8. Operations illustrated in FIG. 1 can also be implemented in the semiconductor structures described in FIGS. 9-11. Operations can be performed in a different order or not performed depending on specific applications. It should be noted that method 100 may not produce a complete semiconductor device. Accordingly, it is understood that additional processes can be provided before, during, and after method 100, and that some other processes may only be briefly described herein.

Figure 2B:
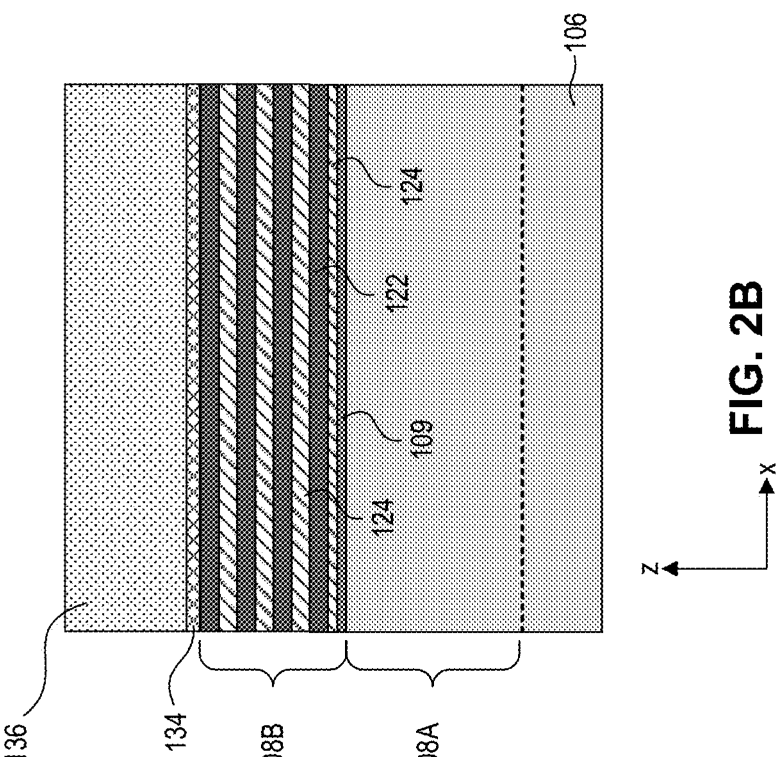
FIGS. 2A-2D, 3A, 3B, and 4-8 illustrate various cross-sectional views of semiconductor devices at various stages of their fabrication process, in accordance with some embodiments.
Figure 2A:
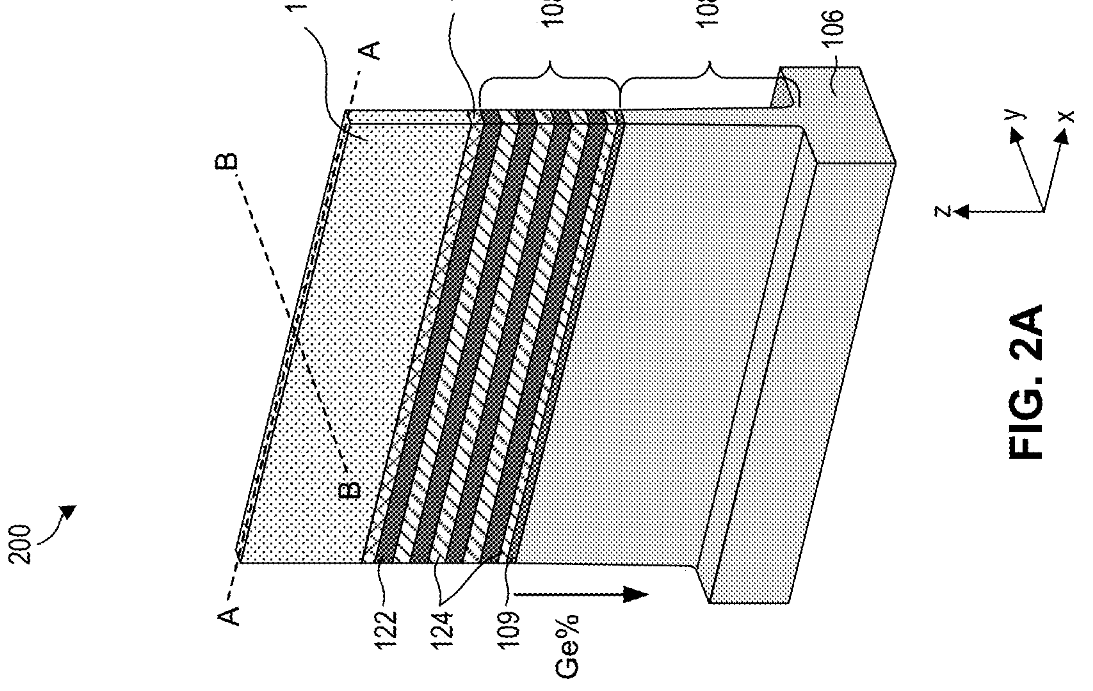
Figure 2D:
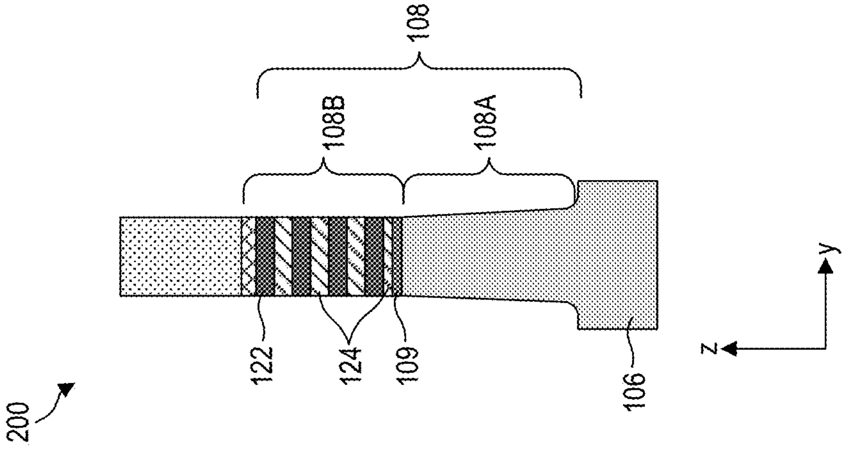
Figure 2C:
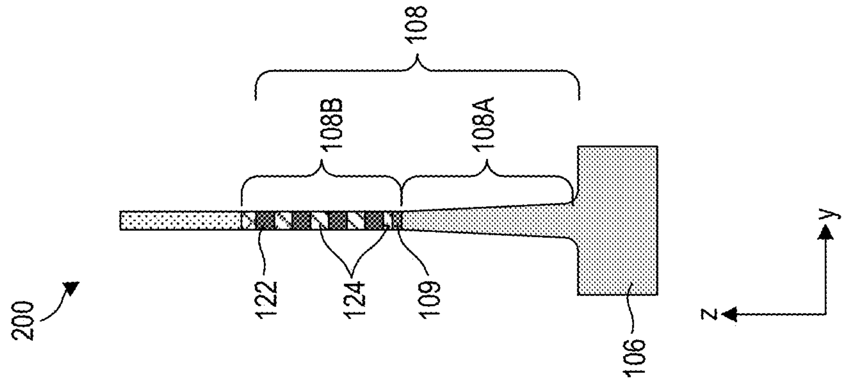

Referring to FIG. 1, in operation 105, counter-doped layers and semiconductor layers are formed on fin structures of a substrate, according to some embodiments. For example, fin structure 108 with fin base portion 108A and fin top portion 108B can be formed on substrate 106 as described with reference to semiconductor device 200 illustrated in FIGS. 2A-2C. FIG. 2B is a cross-sectional view of the structure in FIG. 2A as viewed from the A-A line. FIG. 2C is a cross-sectional view of the structure in FIG. 2A as viewed from the B-B line. The formation of fin structure 108 can include the formation of fin base portion 108A and fin top portion 108B on substrate 106. FIGS. 2A-2C illustrate semiconductor layers formed in a wire configuration (e.g., cross-sectional area having a substantially square shape). Alternatively, semiconductor layers of semiconductor device 200 can also be formed in a sheet configuration (e.g., cross-sectional area having a substantially rectangular shape), as illustrated in FIG. 2D.

Substrate 106 can be a semiconductor material, such as silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Fin structure 108 extends along an x-axis. Fin structure 108 can be a part of a substrate and include a fin base portion 108A and a fin top portion 108B disposed on fin base portion 108A.

Fin base portion 108A can include material similar to substrate 106. Fin base portion 108A can be formed from a photolithographic patterning and an etching of substrate 106. Fin top portion 108B can include a stack of semiconductor layers. Each semiconductor layer can be subsequently processed to form a channel region underlying subsequently formed gate structures of the finFETs.

Fin top portion 108B can include a counter-doped layer 109. Fin top portion 108B also includes a first group of semiconductor layers 122 and a second group of semiconductor layers 124 stacked in an alternating configuration and formed above counter-doped layer 109. Each of semiconductor layers 122 and 124 can be epitaxially grown on its underlying layer and can include semiconductor materials different from each other. In some embodiments, semiconductor layers 122 and 124 can include semiconductor materials similar to or different from substrate 106. In some embodiments, semiconductor layers 122 and 124 can include semiconductor materials with oxidation rates and/or etch selectivities different from each other. In some embodiments, each of semiconductor layers 122 can be formed of silicon and each of semiconductor layers 124 can be formed of silicon germanium. In some embodiments, semiconductor layers 122 can be formed of silicon germanium and semiconductor layers 124 can be formed of silicon. Semiconductor layers 122 and/or semiconductor layers 124 can be undoped or can be in-situ doped during their epitaxial growth process using (i) p-type dopants, such as boron, indium, and gallium; and/or (ii) n-type dopants, such as phosphorus and arsenic. For p-type in-situ doping, p-type doping precursors, such as diborane, boron trifluoride, and any other p-type doping precursor, can be used. For n-type in-situ doping, n-type doping precursors, such as phosphine and arsine, can be used. Though four layers for each of semiconductor layers 122 and semiconductor layers 124 are shown in FIGS. 2A-2C, semiconductor device 200 can have any suitable number of semiconductor layers 122 and semiconductor layers 124.

Counter-doped layer 109 can be formed in contact with a bottom surface of the bottom-most layer of semiconductor layer 124 and in contact with a top surface of substrate 106. In some embodiments, counter-doped layer 109 can be in contact with a top surface of fin base portion 106A, as illustrated in FIGS. 2A and 2B. Counter-doped layer 109 can be formed using a semiconductor material and deposited using suitable dopants. For example, counter-doped layer 109 can be formed using silicon germanium and doped with suitable n-type dopants or p-type dopants. For example, counter-doped layer 109 can be formed of silicon germanium and implanted with boron or phosphorus. In some embodiments, counter-doped layer 109 can be formed using silicon and doped with suitable n-type dopants or p-type dopants. For example, counter-doped layer 109 can be formed of silicon and implanted with boron or phosphorus. The type of dopants implanted in counter-doped layer 109 are opposite to the type of dopants implanted in subsequently formed source/drain structures (not shown in FIGS. 2A-2D but shown as source/drain structures 502 in FIGS. 5-8).

Counter-doped layer 109 can be formed using suitable deposition and implantation methods. In some embodiments, counter-doped layer 109 can be formed by a deposition process followed by an ion implantation process. In some embodiments, the ion implantation process can be performed in-situ (e.g., in the same chamber) during the deposition process. In some embodiments, counter-doped layer 109 can be formed by depositing (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. In some embodiments, counter-doped layer 109 can be a crystalline material formed by an epitaxial growth process.

The ion implantation process for injecting dopants into counter-doped layer 109 can be performed during or after the deposition process of counter-doped layer 109. In some embodiments, counter-doped layer 109 can be doped with p-type dopants (e.g., boron, indium, aluminum, or gallium) or n-type dopants (e.g., phosphorus or arsenic). Ion implantation is a process in the manufacturing of semiconductor devices that provides a controlled method of changing electrical characteristics of selected regions within a semiconductor device. Ion implantation uses an ion implanter to generate ions of a nominal dopant and then accelerates the ions to an appropriate energy level. Once accelerated, the ions are transported by the ion implanter along an ion beam to impact and implant into selected regions of a semiconductor layer, such as the semiconductor material deposited to form counter-doped layer 109. In some embodiments, a dopant concentration of counter-doped layer 109 can be determined by the type of semiconductor devices to be formed. For example, counter-doped layer 109 for a low-leakage GAAFET can have a dopant concentration between about $1\times10^{15}$ (atom/cm$^3$) and about $1\times10^{20}$ (atom/cm$^3$). A counter-doped layer 109 for an ultralow-leakage GAAFET can have a dopant concentration between about $1\times10^{16}$ (atom/cm$^3$) and about $1\times10^{22}$ (atom/cm$^3$). A greater dopant concentration in counter-doped layer 109 can lead to lower leakage currents between the pair of source/drain structures. The leakage current of a low-leakage GAAFET can be between about $1\times10^{-11}$ A and about $1\times10^{-9}$ A, and the leakage current of an ultralow-leakage GAAFET can be between about $1\times10^{-11}$ A and about $1\times10^{-10}$ A. The device types and dopant concentrations described herein are provided as examples and are not intended to be limiting.

Forming fin base portion 108A and fin top portion 108B can also include etching the aforementioned stack of materials through patterned hard mask layers 134 and 136 formed on the stack of materials. In some embodiments, hard mask layer 134 can be a thin film including silicon oxide formed using, for example, a thermal oxidation process. In some embodiments, hard mask layer 136 can be formed of silicon nitride using, for example, low-pressure chemical vapor deposition (LPCVD) or plasma-enhanced chemical vapor deposition (PECVD). The etching of the stack of materials can include a dry etch, a wet etch process, or a combination thereof. Hard mask layers 134 and 136 can be removed after fin structures 108 are formed.

Fin top portions 108B can be formed using stacks of semiconductor layers 122 and 124 in a wire configuration, as shown in FIG. 2C. For example, counter-doped layer 109 and semiconductor layers 122 and 124 in FIG. 2C have a substantially square-shaped cross-sectional area. In some embodiments, fin top portions 108B can be formed using stacks of semiconductor layers 122 and 124 in a sheet configuration, as shown in FIG. 2D. For example, counter-doped layer 109 and semiconductor layers 122 and 124 in FIG. 2C have a substantially rectangular-shaped cross-sectional area. FIGS. 3A, 3B, and 4-8 illustrate forming semiconductor devices with semiconductor layers in a wire configuration which subsequently form nanosheet structures. The method illustrated in the present disclosure also applies to semiconductor devices with semiconductor layers in the sheet configuration that subsequently form nanosheet structures.

Figure 3A:
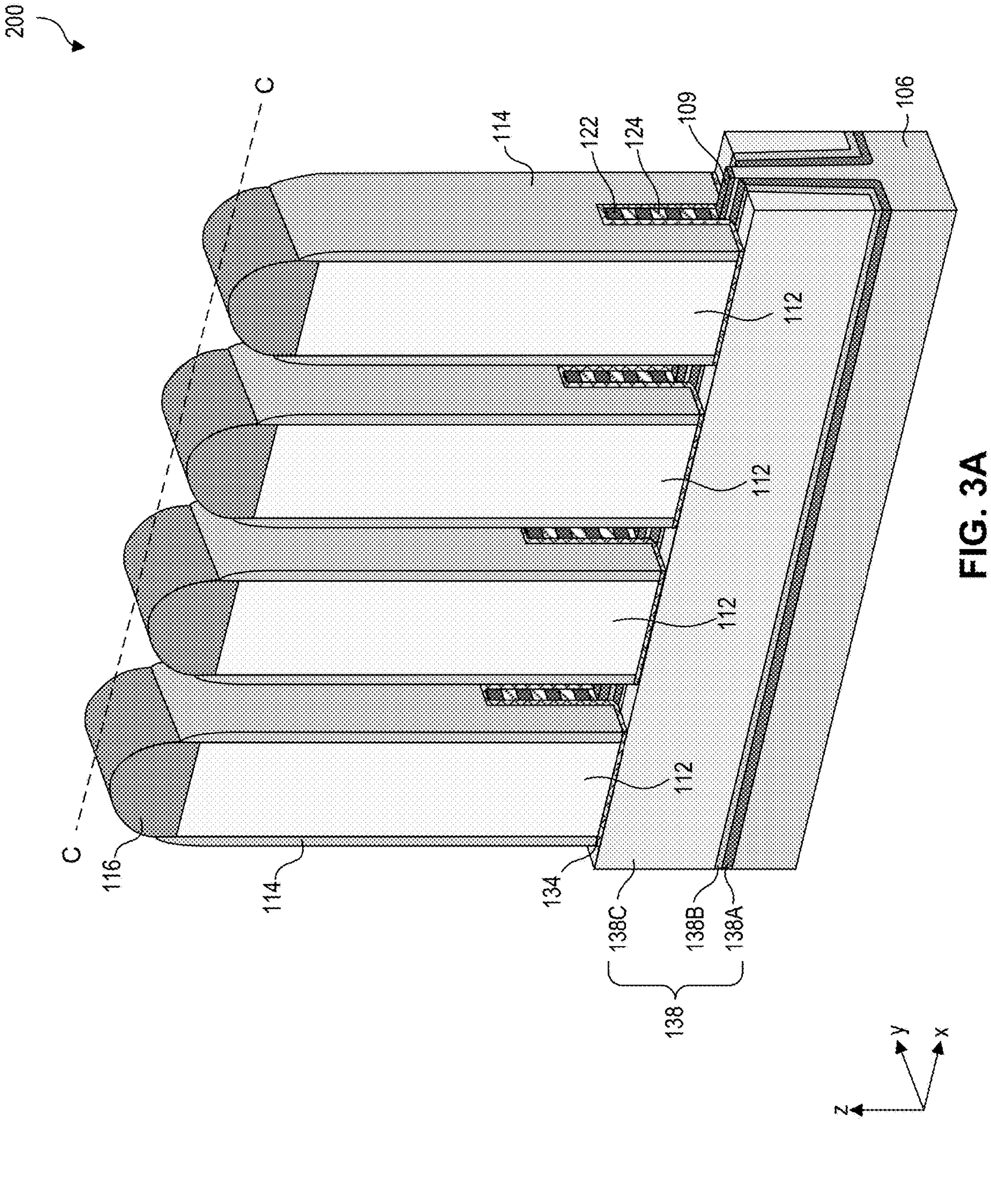
Figure 3B:
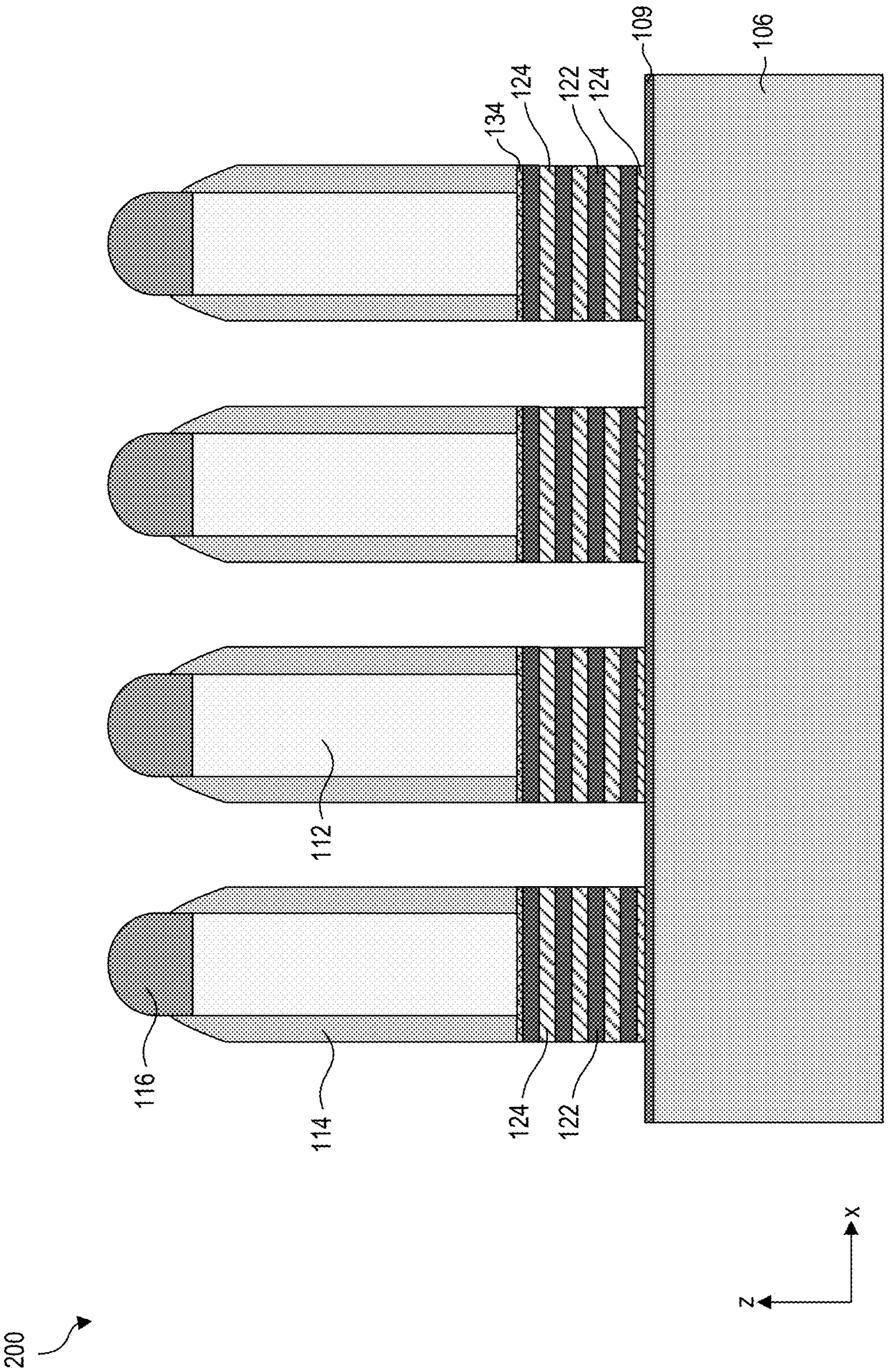

Referring to FIG. 1, in operation 110, sacrificial gate structures are formed on the substrate and the semiconductor layers are etched, according to some embodiments. Referring to FIGS. 3A and 3B, STI regions 138 with first and second protective liners 138A and 138B and insulating layer 138C can be formed on substrate 106. FIG. 3B is a cross-sectional view of semiconductor device 200 in FIG. 3A as viewed from the C-C line. In some embodiments, substrate 106 can include fin bottom portion 108A and are collectively referred to as substrate 106 for simplicity. In some embodiments, hard mask layer 136 remains on the top surfaces of hard mask layer 134 after the formation of STI regions 138. In some embodiments, hard mask layer 136 is removed prior to the formation of STI regions 138. Forming STI regions 138 can include (i) depositing a layer of nitride material (not shown) for first protective liners 138A on the structure of FIG. 2A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 3A. The layers of nitride and oxide materials can be deposited using a suitable process for depositing oxide and nitride materials, such as atomic layer deposition (ALD) and chemical vapor deposition (CVD). These layers of oxide and nitride materials can prevent oxidation of the sidewalls of fin top portion 108B during the deposition and annealing of the insulating material for insulating layer 138C. In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane and oxygen as reacting precursors. In some embodiments, the layer of insulating material can be formed using a sub-atmospheric CVD (SACVD) process or high aspect-ratio process (HARP), where process gases can include tetraethoxysilane (TEOS) and/or ozone.

Polysilicon gate structures 112 are formed on STI regions 138, as shown in FIGS. 3A and 3B. Polysilicon gate structures 112 are sacrificial gate structures and can be replaced in a gate replacement process to form metal gate structures. In some embodiments, the formation of polysilicon gate structures 112 can include blanket depositing a layer of polysilicon material and etching the layer of polysilicon material through a patterned hard mask layer 116 formed on the layer of polysilicon material. In some embodiments, the layer of polysilicon material can be undoped and hard mask layer 116 can include an oxide layer and/or a nitride layer. The oxide layer can be formed using a thermal oxidation process and the nitride layer can be formed by LPCVD or PECVD. Hard mask layer 116 can protect polysilicon gate structures 112 from subsequent processing steps (e.g., during formation of spacers 114, and/or source/drain regions). The blanket deposition of the layer of polysilicon material can include CVD, physical vapor deposition (PVD), ALD, or any other suitable deposition process. In some embodiments, etching of the deposited layer of polysilicon material can include a dry etch, a wet etch, or a combination thereof. Spacers 114 can be formed on sidewalls of polysilicon gate structures 112. Forming spacers 114 can include blanket depositing a layer of an insulating material (e.g., an oxide, a nitride, and/or silicon carbon oxynitride material) followed by photolithography and an etching process (e.g., reactive ion etching or any other suitable dry etching process using a chlorine- or fluorine-based etchant).

Fin top portions can be etched after polysilicon gate structures 112 are formed. The etch process can remove portions of semiconductor layers 122 and 124 that are exposed between adjacent polysilicon gate structures 112. In some embodiments, the etching process can be a cyclic etching process for removing materials that form semiconductor layers 122 and 124, such as etching processes for removing silicon and silicon germanium materials. For example, the etch process can include a wet etch process using, for example, diluted hydrofluoric acid for etching silicon germanium and tetramethylammonium hydroxide (TMAH) for etching silicon material. In some embodiments, one or more etching processes can be used. During the etching process, polysilicon gate structures 112 can be protected by spacers 114 and hard mask layer 116, and the etching process continues until counter-doped layer 109 is exposed. To prevent the etching process from over-etching that can result in the removal or partial removal of exposed counter-doped layer 109, semiconductor layers that are to be removed can be formed using a material different from counter-doped layer 109 such that they can have different etching rates against the chemical etchants. For example, semiconductor layers 124 can be formed with intrinsic silicon germanium and counter-doped layer 109 can be formed with silicon germanium doped with boron or phosphorus. In some embodiments, semiconductor layers 124 can be formed with intrinsic silicon and counter-doped layer 109 can be formed with silicon doped with boron or phosphorus.

Figure 4:
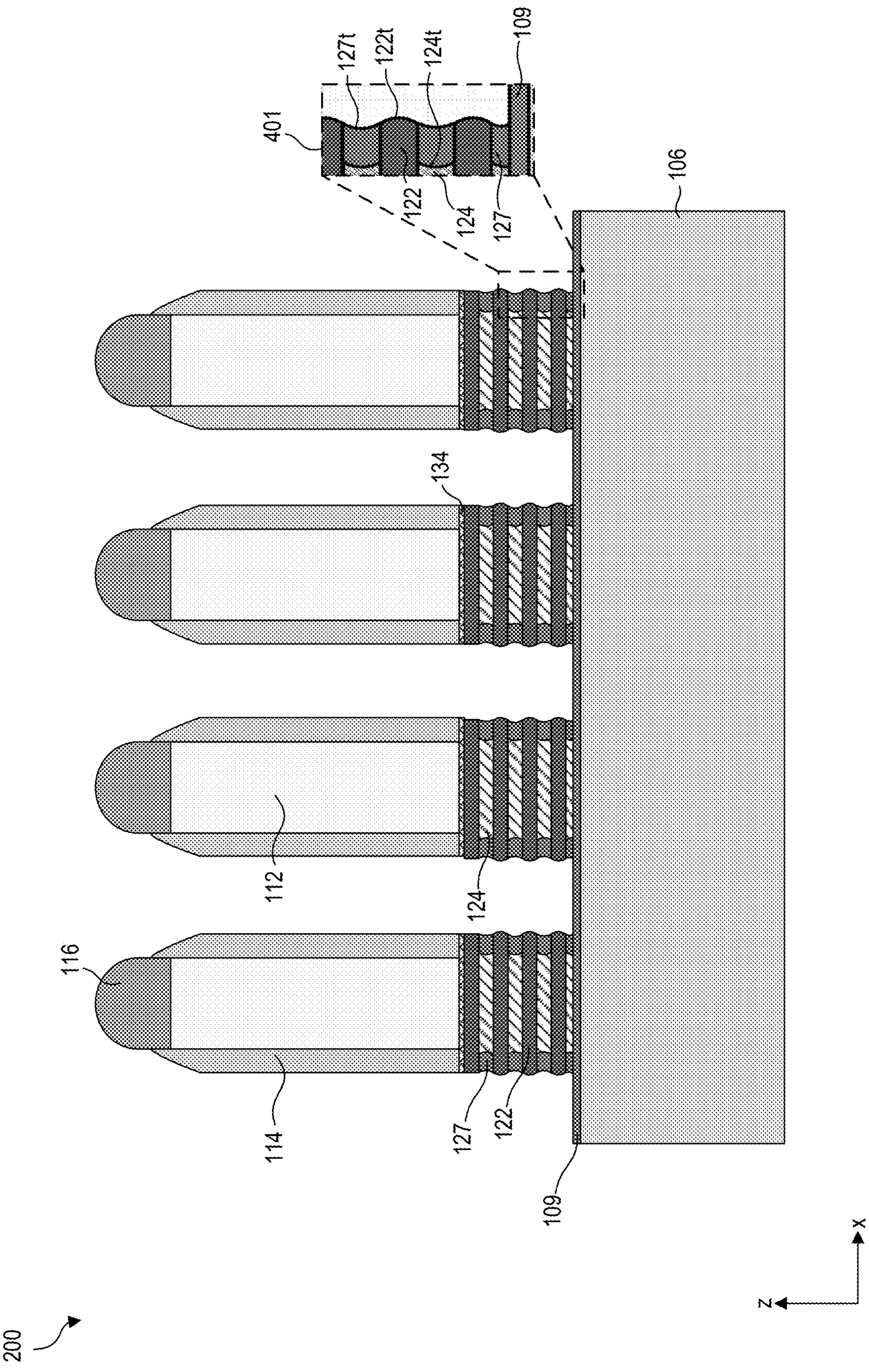

Referring to FIG. 1, in operation 115, inner spacer structures are formed between the semiconductor layers, according to some embodiments. Referring to FIG. 4, portions of semiconductor layers 124 can be etched back to form recessed regions and dielectric material can be deposited in the recessed regions to form inner spacers 127. For example, semiconductor device 200 shown in FIG. 4 can include n-type metal-oxide-semiconductor (NMOS) devices and portions of semiconductor layers 124 are etched back. In some embodiments, substrate 106 can include fin bottom portion 108A and are collectively referred to as substrate 106 for simplicity.

Semiconductor device 200 illustrated in FIG. 4 can include semiconductor layers 124, counter-doped layer 109, and substrate 106 formed using silicon germanium. In some embodiments, semiconductor layers 122 can be formed using silicon. In some embodiments, substrate 106 can be an intrinsic material or doped with suitable dopants. For example, substrate 106 can have a non-uniform dopant concentration. Semiconductor device 200 can also include p-type metal-oxide-semiconductor (PMOS) devices. PMOS device configurations are not shown in FIG. 4 for simplicity. For the PMOS device configurations, semiconductor layers 124 can be processed to be used as the channel regions. Semiconductor layers 122 can be etched back using suitable etching processes and inner spacers 127 can be formed between adjacent semiconductor layers 124 using similar deposition and etching processes described below with respect to the etch back of semiconductor layers 124 and the formation of inner spacers 127.

Semiconductor layers 124 can be etched back by a dry etching process, a wet etching process, or a combination thereof. The etch back process of semiconductor layers 124 can be configured to form non-planar outer surfaces of semiconductor layers 122 and 124. For example, the etching process can include alternating cycles of etching and purging processes. The etching process in each cycle can include using a gas mixture having hydrogen fluoride, nitrogen trifluoride, a fluorine-based gas, and/or a chlorine-based gas. As shown in enlarged view 401 of FIG. 4, semiconductor layers 122 can have curved convex outer surfaces 122*t* and semiconductor layers 124 can have curved concave outer surfaces 124*t*. In some embodiments, subsequently formed inner spacers 127 can also have outer surfaces 127*t* that substantially contour outer surface 124*t* of semiconductor layers 124.

Figure 5:
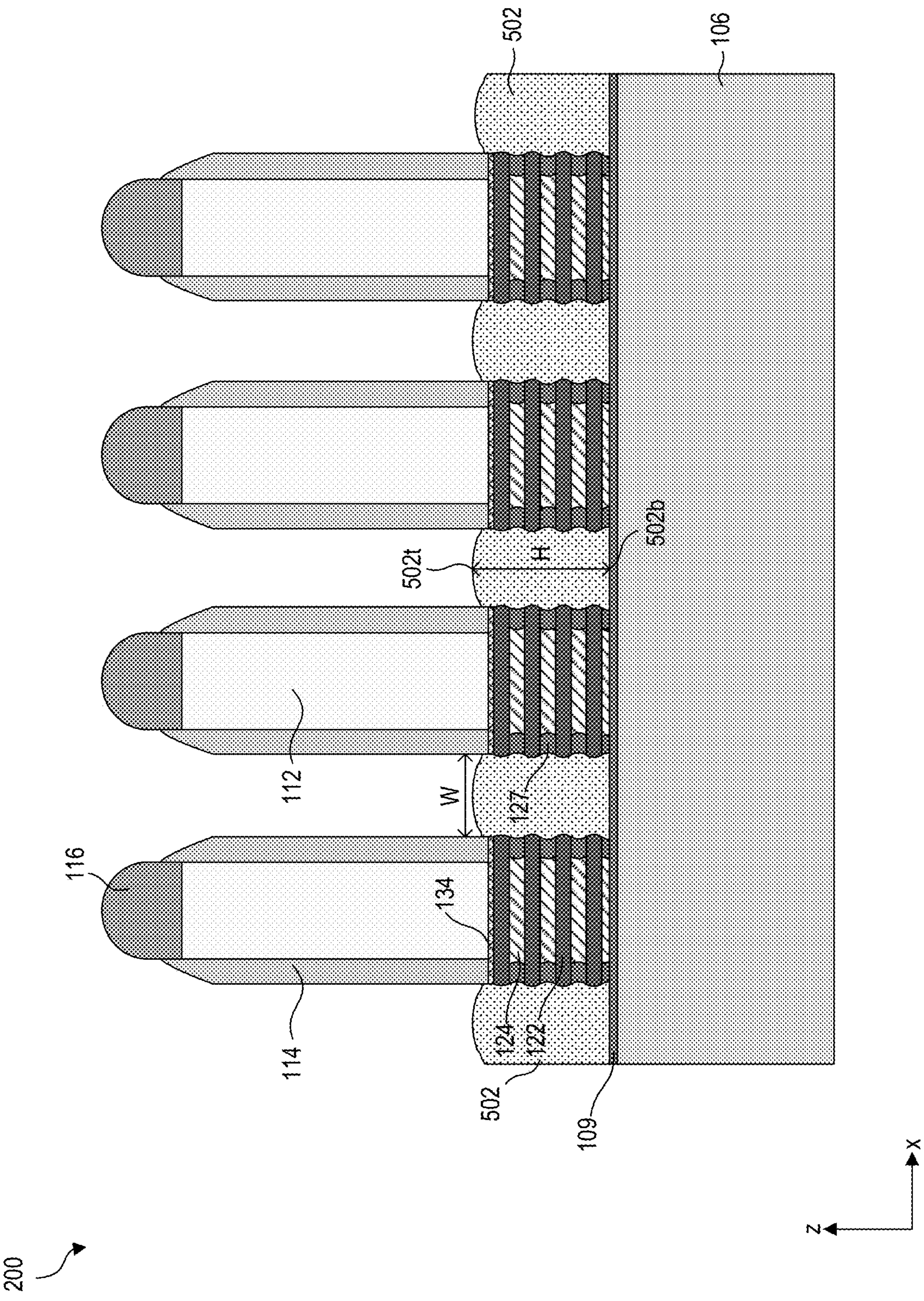

Referring to FIG. 1, in operation 120, source/drain structures are formed on the counter-doped layer, the semiconductor layers, and the inner spacer structures, according to some embodiments. Referring to FIG. 5, source/drain structure 502 can be formed on counter-doped layer 109 as structure as outer surfaces of semiconductor layers 122 and inner spacers 127. In some embodiments, source/drain structure 502 can be formed by a selective growth process where a semiconductor material is grown on selective surfaces. For example, source/drain structure 502 can be formed by epitaxially growing a crystalline material using exposed portions of counter-doped layer 109 as seed layers.

Source/drain structure 502 can be formed of silicon, silicon germanium, silicon phosphide, any suitable semiconductor material, and/or combinations of the same. In some embodiments, source/drain structure 502 can be doped with suitable dopants, such as boron and phosphorus. To reduce leakage current and improve on/off current ratio, source/drain structure 502 and counter-doped layer 109 can be implanted with opposite type of dopants. For example, counter-doped layer 109 can be doped with a p-type dopant and source/drain structure 502 can be doped with an n-type dopant, or vice versa. For example, counter-doped layer 109 can be doped with phosphorus and source/drain structure 502 can be doped with boron. As an example, source/drain structure 502 can be formed using silicon doped with phosphorus and counter-doped layer 109 can be formed using silicon germanium doped with boron. In some embodiments, source/drain structure 502 can be formed using silicon germanium doped with boron and counter-doped layer 109 can be formed using silicon doped with phosphorus. In some embodiments, source/drain structure 502 can be formed using silicon germanium doped with phosphorus and counter-doped layer 109 can be formed using silicon doped with boron. The above materials and dopant implantations are provided as examples and are not intended to be limiting. Similar semiconductor materials and dopant implantations can be used to form source/drain structure 502 and counter-doped layer 109.

Source/drain structure 502 can be formed using suitable deposition or growth methods, such as (i) CVD, including but not limited to, LPCVD, atomic layer CVD (ALCVD), ultrahigh vacuum CVD (UHVCVD), reduced pressure CVD (RPCVD), and any other suitable CVD; (ii) molecular beam epitaxy (MBE) processes; (iii) any suitable epitaxial process; or (iv) a combination thereof. In some embodiments, source/drain structure 502 can be grown by an epitaxial deposition/partial etch process, which repeats the epitaxial deposition/partial etch process at least once. Such repeated deposition/partial etch process is also called a cyclic deposition-etch (CDE) process. In some embodiments, a plasma deposition process using species, such as germane, dichlorosilane, and hydrochloride, can be used to deposit source/drain structure 502 formed of silicon germanium. A width W of source/drain structure 502 can be between about 10 nm and about 80 nm, between about 15 nm and about 75 nm, between about 20 nm and about 60 nm, or any suitable dimensions. In some embodiments, a height H of source/drain structure 502 measured from top surface 502*t* of source/drain structure 502 and bottom surface 502*b* can be between about 20 nm and about 140 nm, between about 30 nm and about 120 nm, between about 40 nm and about 100 nm, or any suitable dimensions.

Figure 6:
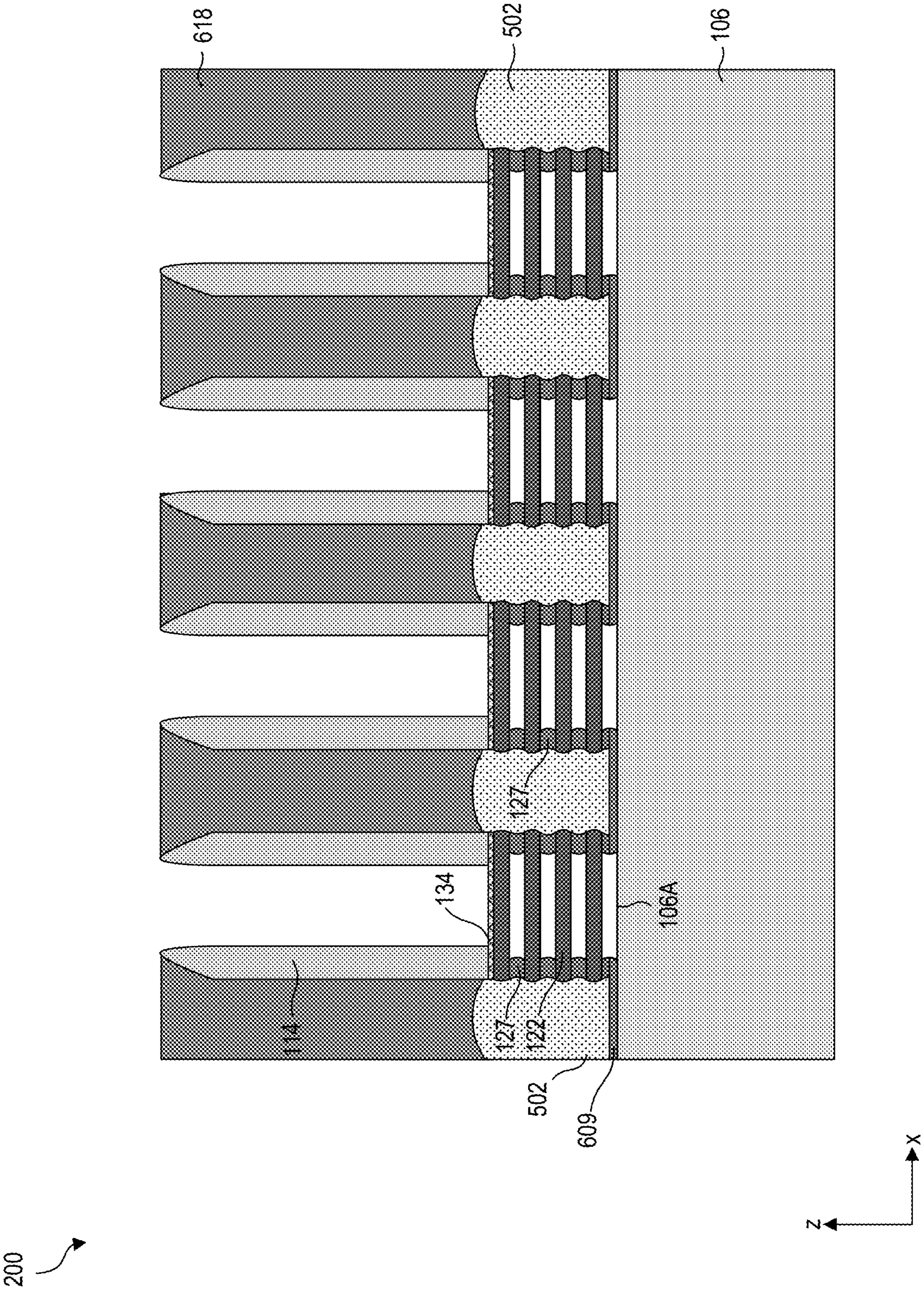

Referring to FIG. 1, in operation 125, nanostructures are released (e.g., exposed) and counter-doped structures are formed under the source/drain structures, according to some embodiments. Referring to FIG. 6, semiconductor layers 124 are removed, exposing portions of semiconductor layer 122 formed between opposite inner spacers 127. The exposed semiconductor layers can be referred to as nanostructures (e.g., nanowires or nanosheets). In some embodiments, semiconductor layers 122 are removed (not illustrated in FIG. 6) and semiconductor layers 124 form nanostructures.

Prior to the release of the nanostructures, an interlayer dielectric (ILD) layer 618 can be deposited between spacers 114 and polysilicon gate structures 112 are removed, according to some embodiments. ILD layer 618 can be disposed on source/drain structure 502 of the source/drain regions and between spacers 114. ILD layer 618 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, the flowable silicon oxide can be deposited using flowable CVD (FCVD). In some embodiments, the dielectric material is silicon oxide. Other materials and formation methods for ILD layer 618 are within the scope and spirit of this disclosure.

The formation of ILD layer 618 can be followed by removing polysilicon gate structures 112 and semiconductor layers 124 using a dry etching process (e.g., reaction ion etching) or a wet etching process, exposing portions of semiconductor layers 122. The exposed semiconductor layers 122 can be referred to as nanostructures (e.g., nanowires or nanosheets). Depending on the type of devices being formed, semiconductor layers 122 can be removed, exposing portions of semiconductor layers 124, which can also be referred to as nanostructures. In some embodiments, the gas etchants used in the dry plasma etching process can include hydrogen and radicals, such as chlorine, fluorine, bromine, or a combination thereof. For example, the gas etchants can include hydrogen bromide, hydrogen chloride, or any suitable gas etchants. In some embodiments, wet chemical etching can be used. Etchants for the wet chemical etching process can include ozone mixed with one or more of hydrogen fluoride, hydrogen chloride, hydrogen peroxide, or any suitable chemical etchants. In some embodiments, a dry etch followed by a wet etch process can be used.

The release of nanostructures, such as semiconductor layers 122, also exposes portions of counter-doped layer 109 under the bottom-most semiconductor layer 122. The exposed portions of counter-doped layer 109 are removed to expose portions of underlying top surface 106A of substrate 106. The remaining portions of counter-doped layer 109 formed under source/drain structures 502 can be referred to as counter-doped structures 609. Exposed portions of counter-doped layer 109 can be removed using suitable etching processes. For example, counter-doped layer 109 formed using silicon germanium doped with suitable dopants can be removed using wet etching or dry plasma etching processes. In some embodiments, the etching process of counter-doped layer 109 can be performed concurrently with the etching of semiconductor layers 122 or 124. For example, semiconductor layer 124 can be formed of intrinsic silicon germanium and counter-doped layer 109 can be formed of silicon germanium doped with n-type or p-type dopants. The etching process to remove portions of semiconductor layer 124 and expose semiconductor layers 122 can also remove counter-doped layer 109 because both semiconductor layer 124 and counter-doped layer 109 are formed using a silicon-germanium-based material.

Figure 7:
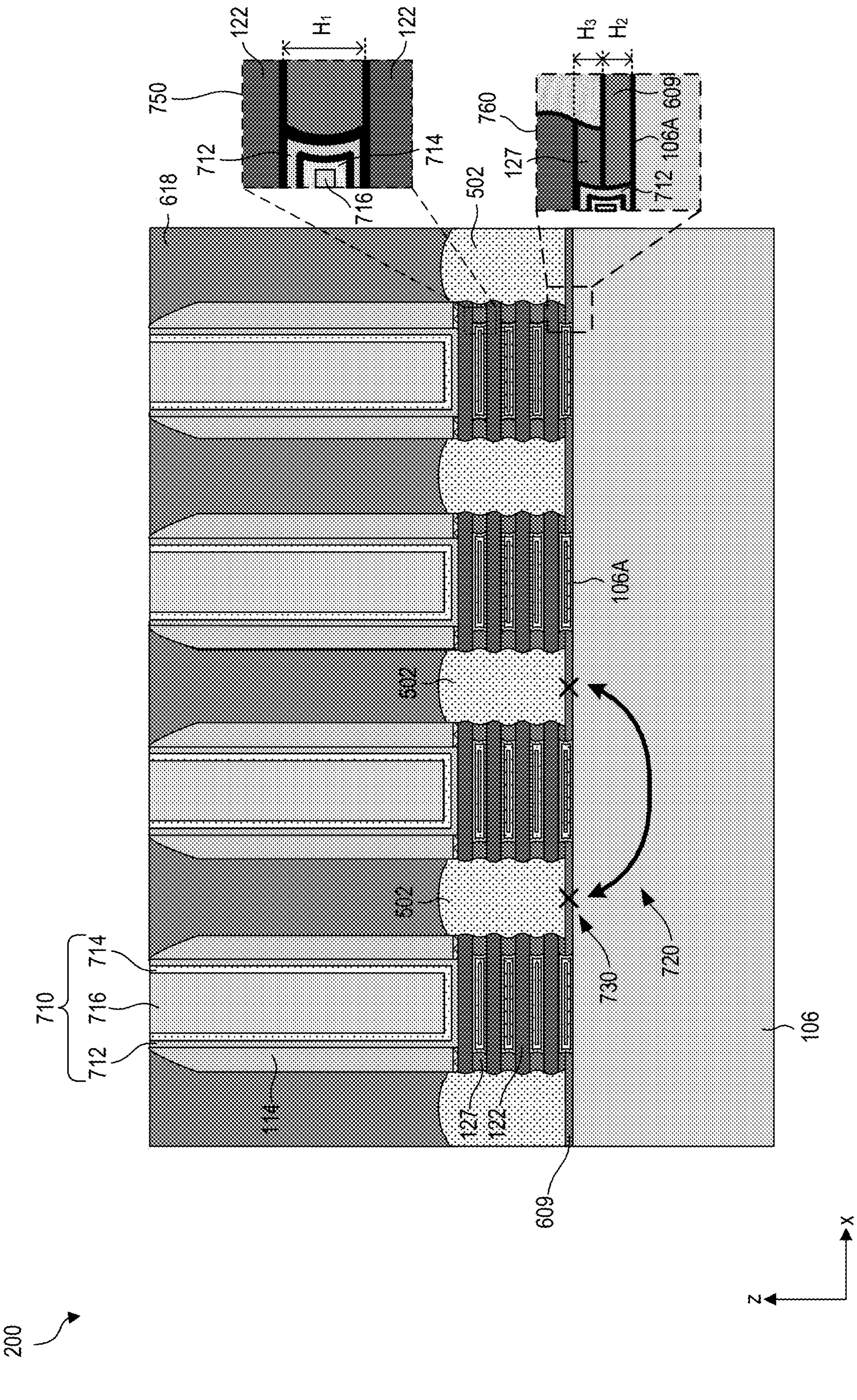

Referring to FIG. 1, in operation 130, gate dielectric layers, work function layers, and gate electrodes are deposited on the nanostructures, according to some embodiments. Referring to FIG. 7, a gate stack 710 including gate dielectric layers 712, work function layers 714, and gate electrode 716 are formed on semiconductor layers 122 and on substrate 106. Because gate dielectric layer 712 of gate stack 710 is deposited on top surface 106A of substrate 106, counter-doped structures 609 have a bottom surface that is substantially coplanar (e.g., level) with a bottom surface of gate dielectric layers 712. Gate stack 710 can include a first portion that wraps around each nanostructure and a second portion formed in contact with counter-doped structure 609, the bottom-most inner spacer 127, and top surface 106A of substrate 106.

Gate dielectric layers 712 can be formed on the semiconductor layers. In some embodiments, gate dielectric layers 712 can be wrapped around exposed nanostructure-shaped semiconductor layers 122. In some embodiments, semiconductor layers 122 can be nanosheets or nanowires. Forming gate dielectric layers 712 can include a blanket deposition process of a suitable gate dielectric material layer. In some embodiments, gate dielectric layers 712 can be formed of a high-k dielectric material (e.g., dielectric material having dielectric constant greater than about 3.9). For example, gate dielectric layers 712 can be formed of hafnium oxide. In some embodiments, one or more gate dielectric layers can be formed. Work function layers 714 are formed on gate dielectric layers 712. In some embodiments, each work function layer 714 can include one or more work function metal layers and formed using the same or different material and/or thickness. In some embodiments, work function layers can include titanium nitride and/or titanium aluminum alloy. Gate dielectric layers 712 and gate work function layers 714 can each wrap around nanostructure-shaped semiconductor layers 122. Depending on the spaces between adjacent semiconductor layers 122, semiconductor layers 122 can be wrapped around by gate dielectric layer 712 and work function layers 714, filling the spaces between adjacent semiconductor layers 122. In some embodiments, subsequently formed gate electrode material can also be formed in the spaces between adjacent semiconductor layers 122, as illustrated in enlarged view 750 and described below.

Gate electrodes 716 can be formed on the work function layers, according to some embodiments. Layers of conductive material for gate electrodes 716 are formed on work function layers 714. As shown in enlarged view 750, if separations between adjacent semiconductor layers 122 are sufficient to accommodate the thickness of the gate electrode material, gate electrodes 716 can be formed between adjacent semiconductor layers 122 and on work function layers 714 such that the spaces between adjacent semiconductor layers 122 are filled. Gate electrodes 716 that are between adjacent semiconductor layers 122 and gate electrodes 716 that are formed between spacers 114 are electrically coupled to each other. The layer of conductive material for gate electrodes 716 can include suitable conductive materials, such as titanium, silver, aluminum, tungsten, copper, ruthenium, molybdenum, tungsten nitride, cobalt, nickel, titanium carbide, titanium aluminum carbide, manganese, zirconium, metal alloys, and combinations thereof. Gate electrodes 716 can be formed by ALD, PVD, CVD, or any other suitable deposition process. The deposition of gate electrodes 716 can continue until openings between opposite spacers 114 are filled with gate electrodes 716. A chemical mechanical polishing process can remove excessive gate electrodes 716 such that top surfaces of gate electrodes 716 and ILD layer 618 are substantially coplanar. In some embodiments, other structures can be formed, such as blocking layers. One or more blocking layers (not shown in FIG. 7) can be formed prior to depositing gate electrodes 716 to prevent diffusion and oxidation of gate electrodes 716.

Counter-doped structures 609 are formed in contact with portions of gate stack 710, substrate 106, source/drain structure 502, and inner spacers 127. Without counter-doped structures 609 formed between substrate 106 and source/drain structure 502, a leakage path 720 can form between the pair of source/drain structures 502 and through the body of substrate 106. However, because counter-doped structures 609 are doped with a dopant that is opposite to source/drain structures 502, there are insufficient charge carriers to support the flowing of electrical current between a pair of source/drain structures 502, such as through counter-doped structures 609 and substrate 106, effectively creating a break such as circuit breaks 730. Therefore, counter-doped structures 609 can reduce leakage current and improve on/off current ratio.

Enlarged views 750 and 760 illustrate portions of gate stack 710, inner spacers 127, and counter-doped structures 609. As shown in enlarged view 750, inner spacers 127 can have height $H_1$ as measured between opposite surfaces from adjacent nanostructures, such as semiconductor layers 122. In some embodiments, height $H_1$ can be between about 3 nm and about 10 nm, between about 5 nm and about 7 nm, or any suitable heights. In some embodiments, the bottom-most inner spacer 127, such as the inner spacer 127 illustrated in enlarged view 760, can have a height $H_3$ less than height $H_1$ of the other inner spacers 127. Counter-doped structures 609 can extend horizontally (e.g., x direction) under the bottom-most inner spacer 127 and in contact with a portion of gate stack 710, such as sidewalls of gate dielectric layer 712. In some embodiments, counter-doped structures 609 can have a height $H_2$ as measured from a bottom surface of the bottom-most inner spacer 127 and top surface 106A of substrate 106. In some embodiments, height $H_2$ can be between about 1 nm and about 8 nm, between about 2 nm and about 5 nm, between about 3 nm and about 4 nm. In some embodiments, height $H_2$ can be between about 1 nm and about 2 nm. In some embodiments, height $H_2$ of counter-doped structures 609 is less than height $H_1$ of inner spacer 127. For example, the sum of heights $H_2$ and $H_3$ substantially equals to height $H_1$ of inner spacer 127. In some embodiments, a height ratio of height $H_2$ over height $H_1$ can be between about 0.3 and about 0.8. For example, the ratio can be between about 0.35 and about 0.75, between about 0.4 and about 0.7, between about 0.45 and about 0.65, between about 0.5 and about 0.6, or any suitable ratios. Ratios lower than about 0.3 can indicate a lower thickness of counter-doped structures 609 and lead to insufficient reduction of charge carriers that in turn can result in insufficient reduction of leakage current. Ratios greater than about 0.8 can result in voids during the formation of bottom-most inner spacer 127 which in turn can lead to circuit shortage and low device yield. A greater ratio of $H_2$ over $H_1$ can indicate a greater thickness of counter-doped structures 609 which can provide the benefits of, among other things, lower leakage current and improved on/off current ratio.

Figure 8:
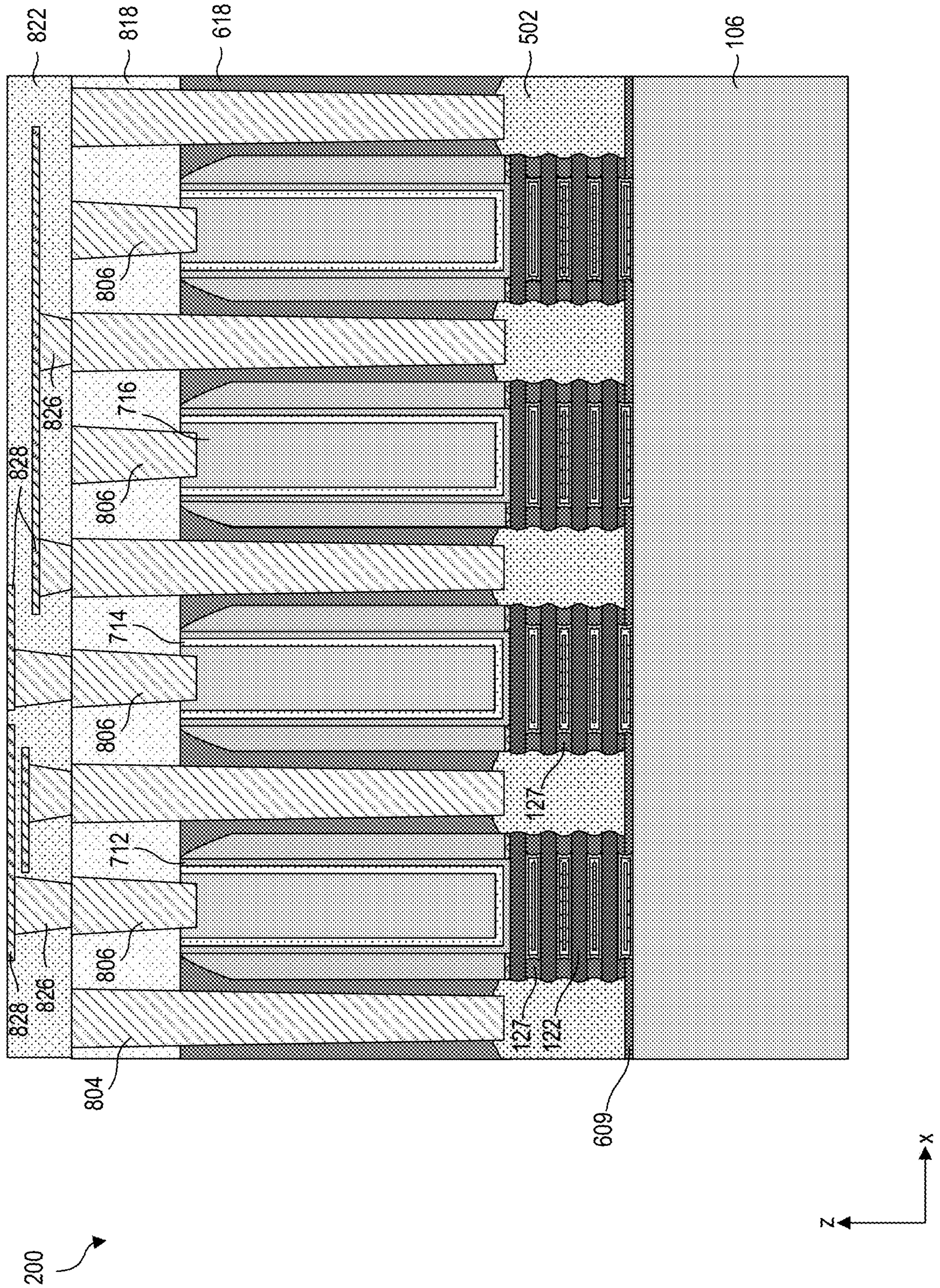

Referring to FIG. 1, in operation 135, source/drain contacts and gate contacts are formed, according to some embodiments. Referring to FIG. 8, source/drain contacts 804 and gate contacts 806 are formed to provide electrical connections to the source/drain regions and the gate electrodes, respectively. Specifically, source/drain contacts 804 and gate contacts 806 can be used to transmit electrical signals between source/drain regions and gate electrodes and external terminals (not shown in FIG. 8). For example, gate contacts 806 can be electrically coupled to gate electrodes 716 formed between spacers 114 and between adjacent semiconductor layers 122. Additional ILD layers can be formed on the top surface of ILD layer 618. For example, dielectric layer 818 can be formed on ILD layer 618. In some embodiments, dielectric layer 818 can be formed using similar material as ILD layer 618. Gate contacts 806 and source/drain contacts 804 can be formed by forming openings in dielectric layer 818, gate electrodes 716, and ILD layer 618, and depositing a conductive material in the openings. The deposition process can include depositing a metal layer within the openings and performing an anneal process to induce silicidation of the deposited metal layer. The conductive materials for forming source/drain contacts 804 and gate contacts 806 can include titanium, aluminum, silver, tungsten, cobalt, copper, ruthenium, zirconium, nickel, titanium nitride, tungsten nitride, metal alloys, and/or combinations thereof. The deposition process can include ALD, PVD, CVD, any suitable deposition processes, and/or combinations thereof. Gate contacts 806 and source/drain contacts 804 can be connected to gate electrodes 716 and source/drain structure 502, respectively.

A planarization process can planarize the top surfaces of dielectric layer 818, source/drain contacts 804, and gate contacts 806 such that the top surfaces are substantially coplanar. In some embodiments, gate contacts 806 can extend into gate electrodes 716. Silicide regions (not shown in FIG. 8) can be formed between source/drain contacts 804 and source/drain structures 502 to reduce contact resistance. In some embodiments, the silicide regions can include ruthenium silicide, nickel silicide, cobalt silicide, tungsten silicide, tantalum silicide, platinum silicide, erbium silicide, palladium silicide, any suitable silicide material, and/or combinations thereof.

Back-end-of-line (BEOL) interconnect structures are formed over source/drain contacts 804 and gate contacts

806. BEOL interconnect structures can be formed in dielectric layers 822 deposited on dielectric layer 818. Interconnects can be formed in dielectric layer 822. In some embodiments, the interconnects can be a network of electrical connections that include vias 826 extending vertically (e.g., along the z-axis) and wires 828 extending laterally (e.g., along the x-axis). Interconnect structures can provide electrical connections to source/drain contacts 804 and gate contacts 806. In some embodiments, suitable passive and active semiconductor devices can be formed in dielectric layers 818 and 822 and are not illustrated for simplicity.

Figure 9:
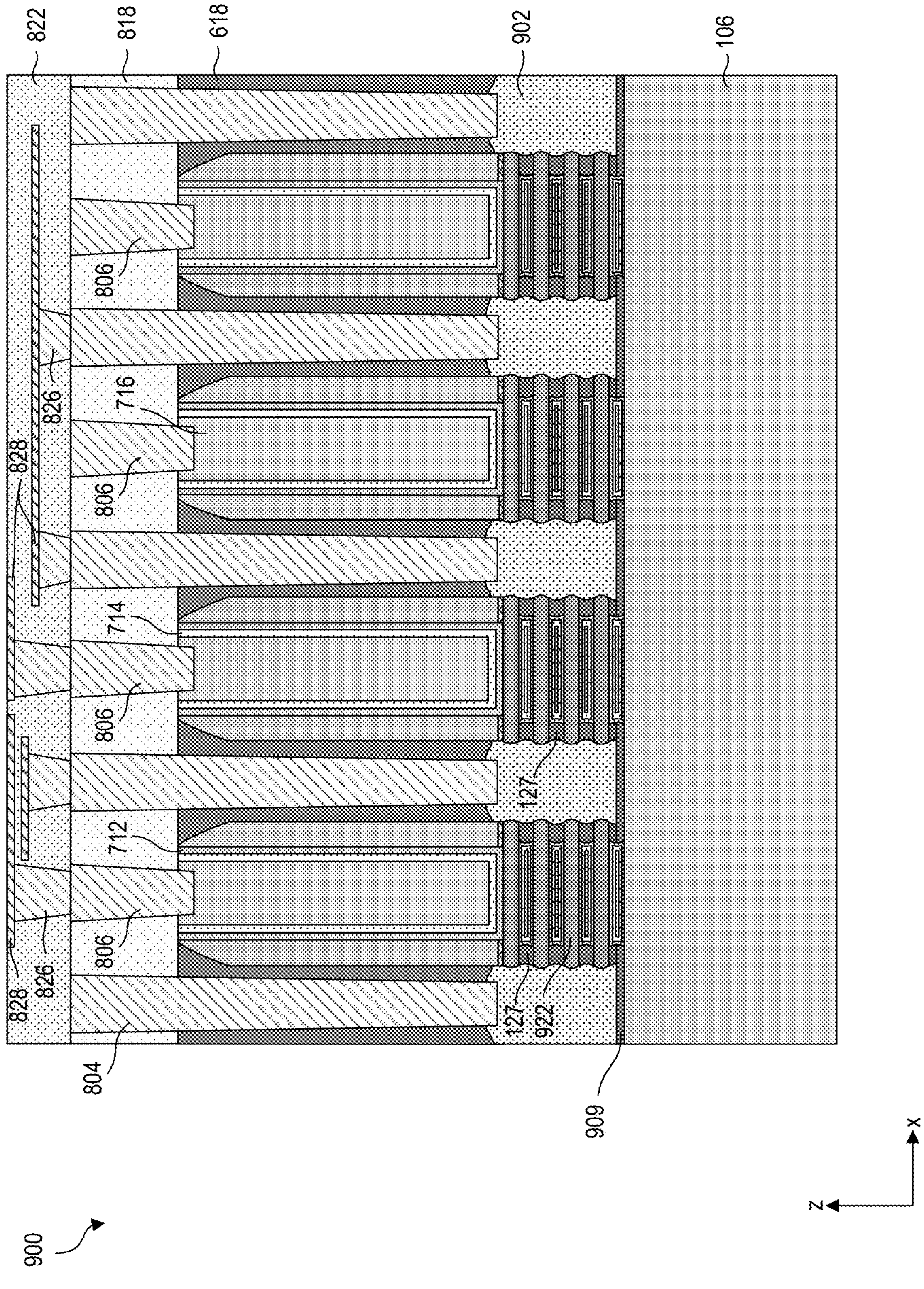
FIGS. 9-11 illustrate various semiconductor devices incorporating counter-doped structures, in accordance with some embodiments.
Figure 10:
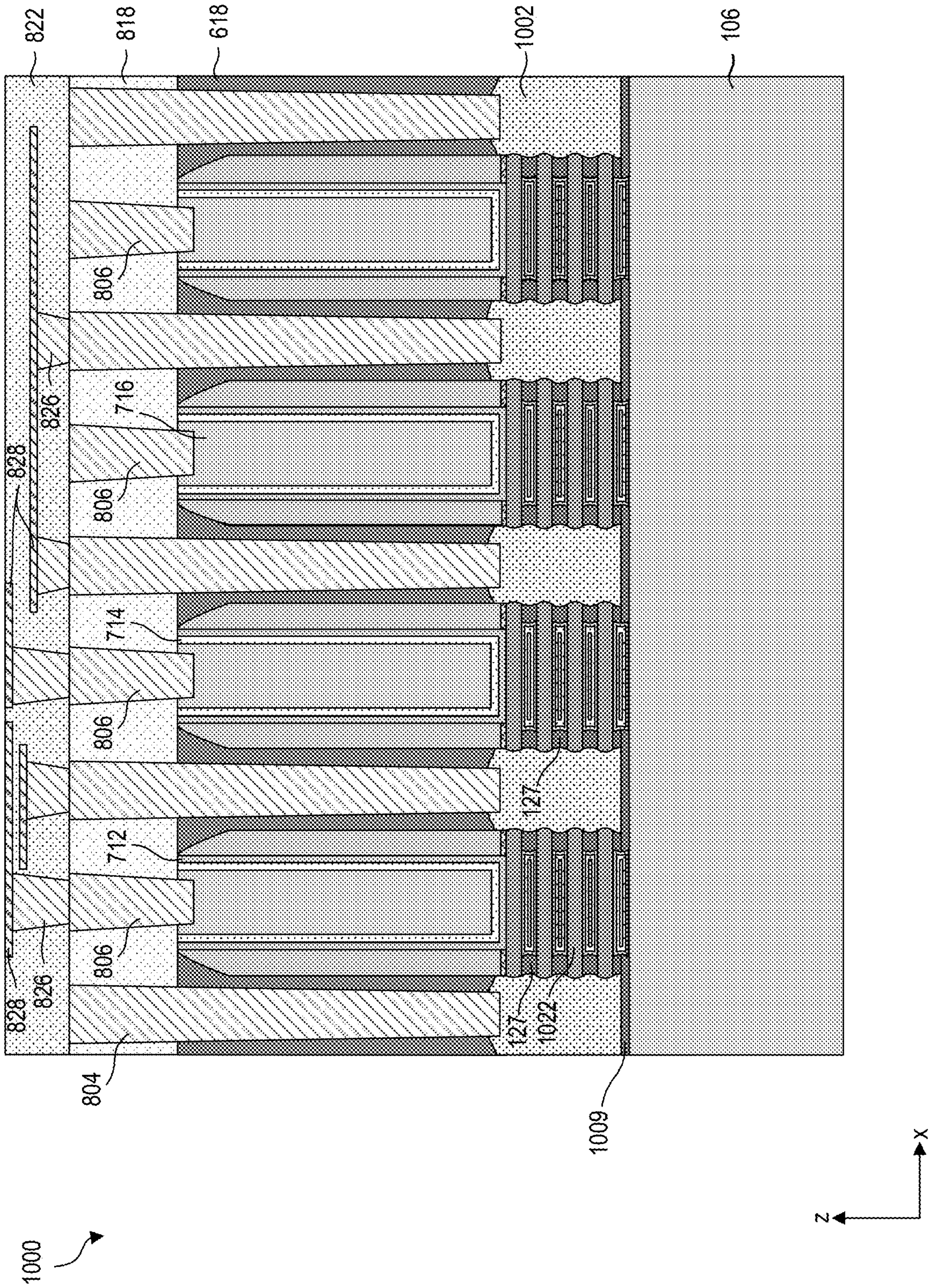
Figure 11:
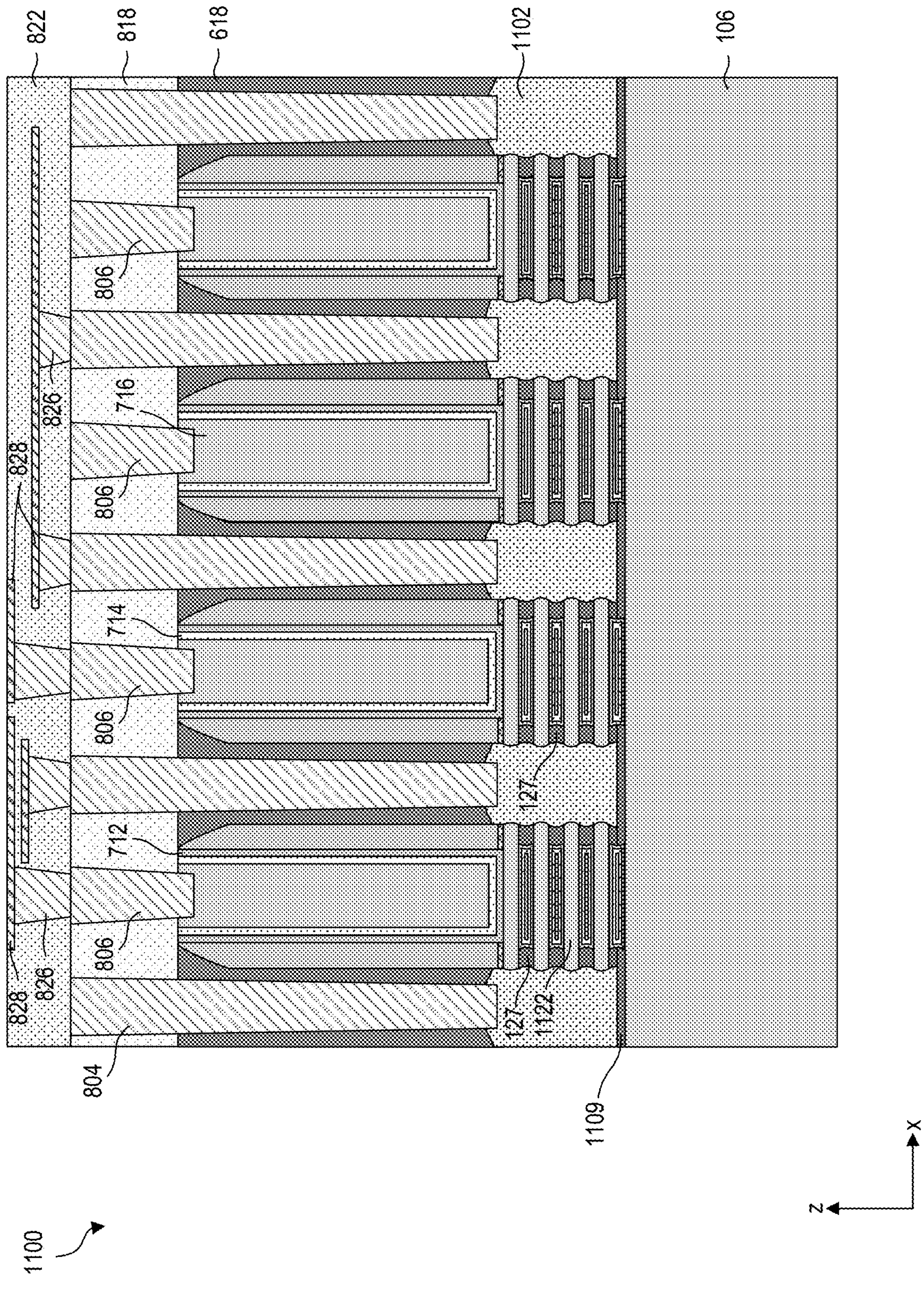

FIGS. 9-11 illustrate various semiconductor structures incorporating counter-doped structures to reduce leakage current. Reference numerals in FIGS. 9-11 that are similar to those in FIGS. 2A-8 generally indicate identical, functionally similar, and/or structurally similar elements.

FIG. 9 illustrates a semiconductor structure 900 incorporating counter-doped structures, according to some embodiments. Semiconductor structure 900 includes substrate 106 and semiconductor layers 922 formed using silicon. Source/drain structures 902 can be formed using silicon germanium doped with p-type dopants, such as boron and/or gallium. Semiconductor layers 922 can be nanostructures, such as nanosheets or nanowires. In some embodiments, semiconductor layers 922 can be formed using silicon material. Counter-doped structures 909 can be formed using silicon germanium doped with n-type dopants, such as phosphorus and/or arsenic. Similar to the formation of counter-doped structures 609 described in FIGS. 2A-8, counter-doped structures 909 can be formed using deposition and ion implantation processes followed by an etching process. For example, counter-doped structures 909 can be formed on substrate 106 by depositing a layer of silicon germanium material and performing an ion implantation process using n-type dopants. Dopant concentration of counter-doped structures 909 can be similar to that of counter-doped structures 609. For example, a greater dopant concentration can provide the benefit of lower leakage current.

FIG. 10 illustrates a semiconductor structure 1000 incorporating counter-doped structures, according to some embodiments. Semiconductor structure 1000 includes substrate 106 and semiconductor layers 1022 formed using silicon germanium. Source/drain structures 1002 can be formed using silicon germanium doped with p-type dopants, such as boron and/or gallium. Semiconductor layers 1022 can be nanostructures, such as nanosheets or nanowires. In some embodiments, semiconductor layers 1022 can be formed using silicon germanium material. Counter-doped structures 1009 can be formed using silicon doped with n-type dopants, such as phosphorus and/or arsenic. Similar to the formation of counter-doped structures 609 described in FIGS. 2A-8, counter-doped structures 1009 can be formed using deposition and ion implantation processes followed by an etching process. For example, counter-doped structures 1009 can be formed on substrate 106 by depositing a layer of silicon material and performing an ion implantation process using n-type dopants. Dopant concentration of counter-doped structures 1009 can be similar to that of counter-doped structures 609. For example, a greater dopant concentration can provide the benefit of lower leakage current.

FIG. 11 illustrates a semiconductor structure 1100 incorporating counter-doped structures, according to some embodiments. Semiconductor structure 1100 includes substrate 106 and semiconductor layers 1122 formed using silicon germanium. Source/drain structures 1102 can be formed using silicon germanium doped with n-type dopants, such as phosphorus and/or arsenic. Semiconductor layers 1122 can be nanostructures, such as nanosheets or nanowires. In some embodiments, semiconductor layers 1122 can be formed using silicon germanium material. Counter-doped structures 1109 can be formed using silicon doped with p-type dopants, such as boron and/or gallium. Similar to the formation of counter-doped structures 609 described in FIGS. 2A-8, counter-doped structures 1109 can be formed using deposition and ion implantation processes followed by an etching process. For example, counter-doped structures 1109 can be formed on substrate 106 by depositing a layer of silicon material and performing an ion implantation process using p-type dopants. Dopant concentration of counter-doped structures 1109 can be similar to that of counter-doped structures 609. For example, a greater dopant concentration can provide the benefit of lower leakage current.

Various embodiments in the present disclosure describe methods for forming counter-doped structures between source/drain structures and an underlying substrate. The counter-doped structures can be doped with dopants that are opposite in conductivity type to the dopants implanted in the source/drain structures. For example, a counter-doped structure doped with n-type dopants can be formed under a source/drain structure doped with p-type dopants, or vice versa. The counter-doped structures described herein provide various benefits, such as improved device performance and reliability. Benefits can also include, but are not limited to, reduced short channel effects, reduced subthreshold leakage, and improved device on/off current characteristics.

In some embodiments, a semiconductor device includes nanostructures over a substrate and a source/drain region in contact with the nanostructures. The source/drain region is doped with a first-type dopant. The semiconductor device also includes a counter-doped structure in contact with the substrate and the source/drain region. The counter-doped structure is doped with a second-type dopant opposite to the first-type dopant.

In some embodiments, a semiconductor device includes nanostructures formed over a substrate. The semiconductor device also includes inner spacers with each inner spacer formed under a nanostructure of the nanostructures. The semiconductor device further includes a source/drain structure in contact with the nanostructures and the inner spacers. The source/drain structure is doped with a first-type dopant. The semiconductor device also includes a counter-doped structure in contact with the source/drain structure and the substrate. The counter-doped structure is doped with a second-type dopant opposite to the first-type dopant. The semiconductor device further includes a gate structure. The gate structure includes a first portion wrapped around each nanostructure of the nanostructures and a second portion in contact with the counter-doped structure and formed under a bottom-most nanostructure of the nanostructures.

In some embodiments, a method includes depositing a counter-doped layer on a substrate and doping the counter-doped layer with a first-type dopant. The method also includes depositing first and second groups of semiconductor layers on the counter-doped layer to form a stack of alternating semiconductor layers. The method further includes forming spacers on sidewalls of the first group of semiconductor layers and forming a source/drain structure in contact with the counter-doped layer and the spacers. The method further includes doping the source/drain structure with a second-type dopant opposite to the first-type dopant and removing the first group of semiconductor layers. The method also includes removing a portion of the counter-doped layer to form a counter-doped structure under the source/drain structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a plurality of nanostructures over a substrate;

a source/drain region in direct contact with the plurality of nanostructures, wherein the source/drain region is doped with a first-type dopant; and a counter-doped structure electrically isolating the substrate from the source/drain region, wherein the counter-doped structure is doped with a second-type dopant opposite to the first-type dopant.

2. The semiconductor device of claim 1, further comprising a gate structure in contact with the counter-doped structure.

3. The semiconductor device of claim 1, further comprising a gate dielectric layer in contact with a bottom-most nanostructure of the plurality of nanostructures, wherein the counter-doped structure is in contact with a sidewall surface of the gate dielectric layer.

4. The semiconductor device of claim 1, wherein the first-type dopant comprises an n-type dopant and the second-type dopant comprises a p-type dopant.

5. The semiconductor device of claim 1, wherein the first-type dopant comprises a p-type dopant and the second-type dopant comprises an n-type dopant.

6. The semiconductor device of claim 1, wherein the source/drain region comprises silicon germanium and the counter-doped structure comprises silicon.

7. The semiconductor device of claim 1, wherein the source/drain region comprises silicon and the counter-doped structure comprise silicon germanium.

8. The semiconductor device of claim 1, further comprising a plurality of inner spacers, wherein each inner spacer is in contact with a bottom surface of a nanostructure of each of the nanostructures.

9. The semiconductor device of claim 8, wherein a horizontal top surface of the counter-doped structure is in contact with a bottom surface of a bottom-most inner spacer of the plurality of inner spacers.

10. A semiconductor device, comprising:

a plurality of nanostructures over a substrate;

a plurality of inner spacers, wherein each inner spacer is formed under a nanostructure of the plurality of nanostructures;

a source/drain structure in contact with the plurality of nanostructures and the plurality of inner spacers, wherein the source/drain structure is doped with a first-type dopant;

a counter-doped structure in contact with the source/drain structure and the substrate, wherein the counter-doped structure is doped with a second-type dopant opposite to the first-type dopant; and a gate structure, comprising:

a first portion wrapped around each nanostructure of the plurality of nanostructures; and a second portion in contact with the counter-doped structure and formed under a bottom-most nanostructure of the plurality of nanostructures.

11. The semiconductor device of claim 10, wherein the first-type dopant comprises an n-type dopant and the second-type dopant comprises a p-type dopant.

12. The semiconductor device of claim 10, wherein the first-type dopant comprises a p-type dopant and the second-type dopant comprises an n-type dopant.

13. The semiconductor device of claim 10, wherein an inner spacer of the plurality of inner spacers has a height greater than that of the counter-doped structure.

14. The semiconductor device of claim 10, wherein an interface between the counter-doped structure and a bottom-most inner spacer of the plurality of inner spacers is substantially horizontal.

15. The semiconductor device of claim 10, wherein a horizontal interface between the source/drain structure and the counter-doped structure is coplanar with a horizontal interface between a bottommost inner spacer of the plurality of inner spacers and the counter-doped structure.

16. A semiconductor device, comprising:

a semiconductor layer on a substrate, wherein the semiconductor layer is doped with a first type dopant;

a plurality of nanostructures on the substrate;

a gate structure surrounding the plurality of nanostructures, wherein horizontal bottom surfaces of the gate structure and the semiconductor layer are substantially coplanar; and a source/drain (S/D) region on the semiconductor layer and adjacent to the plurality of nanostructures, wherein the S/D region is doped with a second type dopant opposite to the first-type dopant.

17. The semiconductor device of claim 16, wherein a thickness of the semiconductor layer is less than a distance between adjacent nanostructures of the plurality of nanostructures.

18. The semiconductor device of claim 17, wherein a ratio of the thickness of the semiconductor layer to the distance between the adjacent nanostructures of the plurality of nanostructures is between about 0.3 and about 0.8.

19. The semiconductor device of claim 16, wherein the gate structure is in contact with a side surface of the semiconductor layer.

20. The semiconductor device of claim 16, further comprising an inner spacer below a bottommost nanostructure of the plurality of nanostructures, wherein a thickness of the gate structure is substantially the same as a sum of thicknesses of the inner spacer and the semiconductor layer.

* * * * *